US007632762B2

(12) United States Patent
Tiano et al.

(10) Patent No.: US 7,632,762 B2
(45) Date of Patent: Dec. 15, 2009

(54) CARBON NANOTUBE-BASED ELECTRONIC DEVICES MADE BY ELECTROLYTIC DEPOSITION AND APPLICATIONS THEREOF

(75) Inventors: Thomas Tiano, Westford, MA (US); John Gannon, Sudbury, MA (US); Charles Carey, Burlington, MA (US); Brian Farrell, Quincy, MA (US); Richard Czerw, Clemmons, NC (US)

(73) Assignee: Foster Miller, Inc., Waltham, MA (US)

( * ) Notice: Subject to any disclaimer, the term of this patent is extended or adjusted under 35 U.S.C. 154(b) by 57 days.

(21) Appl. No.: 11/638,571

(22) Filed: Dec. 14, 2006

(65) Prior Publication Data

US 2007/0224804 A1 Sep. 27, 2007

Related U.S. Application Data

(62) Division of application No. 11/090,193, filed on Mar. 28, 2005, now abandoned.

(60) Provisional application No. 60/557,118, filed on Mar. 26, 2004.

(51) Int. Cl.
*H01L 51/30* (2006.01)

(52) U.S. Cl. .................. 438/800; 257/E51.04; 977/888

(58) Field of Classification Search ....................... None
See application file for complete search history.

(56) References Cited

U.S. PATENT DOCUMENTS 6,423,583 B1 7/2002 Avouris et al.
6,465,813 B2 10/2002 Ihm
6,590,231 B2 7/2003 Watanabe et al.
6,677,624 B2 * 1/2004 Ihm ........................... 257/183
6,852,582 B2 2/2005 Wei et al.
2001/0023986 A1 9/2001 Mancevski
2002/0020841 A1 2/2002 Ihm
2002/0130353 A1 9/2002 Lieber et al.

(Continued)

OTHER PUBLICATIONS

P. G. Collins, et al. “Engineering Carbon Nanotubes and Nanotube Circuits Using Electrical Breakdown,” *Science* 27; vol. 292, pp. 706-709; Apr. 27, 2001.

*Primary Examiner*—Sue Purvis
*Assistant Examiner*—Benjamin P Sandvik
(74) *Attorney, Agent, or Firm*—Dickstein Shapiro LLP

(57) ABSTRACT

Carbon nanotube-based devices made by electrolytic deposition and applications thereof are provided. In a preferred embodiment, the present invention provides a device comprising at least one array of active carbon nanotube junctions deposited on at least one microelectronic substrate. In another preferred embodiment, the present invention provides a device comprising a substrate, at least one pair of electrodes disposed on the substrate, wherein one or more pairs of electrodes are connected to a power source, and a bundle of carbon nanotubes disposed between the at least one pair of electrodes wherein the bundle of carbon nanotubes consist essentially of semiconductive carbon nanotubes. In another preferred embodiment, a semiconducting device formed by electrodeposition of carbon nanotubes between two electrodes is provided. The invention also provides preferred methods of forming a semiconductive device by applying a bias voltage to a carbon nanotube rope. The plurality of metallic single-wall carbon nanotubes are removed (e.g., by application of bias voltage) in an amount sufficient to form the semiconducting device. The devices of the invention include, but not limited to, chemical or biological sensors, carbon nanotube field-effect transistors (CNFETs), tunnel junctions, Schottky junctions, and multi-dimensional nanotube arrays.

20 Claims, 11 Drawing Sheets

U.S. PATENT DOCUMENTS

2002/0173083 A1* 11/2002 Avouris et al. .............. 438/129
2003/0122133 A1 7/2003 Choi et al.
2003/0148086 A1 8/2003 Pfefferle et al.
2004/0038251 A1* 2/2004 Smalley et al. ................. 435/6
2004/0125733 A1 7/2004 Lee et al.
2004/0149978 A1* 8/2004 Snider ........................... 257/3
2004/0224490 A1 11/2004 Wei et al.
2005/0012163 A1 1/2005 Wei et al.
2005/0106846 A1* 5/2005 Dubin ........................ 438/585
2008/0041814 A1* 2/2008 Romano et al. ............... 216/13

* cited by examiner

Attachment process 700

CARBON NANOTUBE-BASED ELECTRONIC DEVICES MADE BY ELECTROLYTIC DEPOSITION AND APPLICATIONS THEREOF

CROSS-REFERENCES TO RELATED APPLICATIONS

This application is a divisional of application Ser. No. 11/090,193, filed Mar. 28, 2005 now abandoned, which claims priority to U.S. Provisional Patent Application No. 60/557,118 filed on Mar. 26, 2004 which is hereby incorporated by reference in its entirety.

STATEMENT REGARDING FEDERALLY SPONSORED RESEARCH OR DEVELOPMENT

The United States Government may have certain rights in this invention pursuant to Grant Numbers F19628-03-C-0075 and N41756-02-M-1043.

FIELD OF THE INVENTION

The present invention relates to carbon nanotube-based electronic devices. In particular, this invention relates to carbon nanotube-based electronic devices made by electrolytic deposition.

BACKGROUND OF THE INVENTION

The semiconductor industry is facing increasingly difficult technological challenges, as it moves into the production of features at sizes below 100 nanometers. Particular challenges are to achieve affordable scaling and achieve affordable lithography with dimensions below 100 nanometers, utilize new materials and structures, and achieve gigahertz frequency operations and very high device densities on chips. There is a lack of consensus in the industry about how to solve the fabrication challenges that lie beyond the 100 nanometer barrier. The problem confronting the industry is that the dominant technology used to make chips, optical lithography, uses light to form patterns on silicon. Below 100 nanometers, the wavelength of light that is, typically, employed in chip production (193 nanometers and 157 nanometers) is too large to be useful. Several candidate technologies are currently vying for selection as successors to optical lithography. These include extreme ultraviolet lithography (EUV), an electron beam method called scalpel, and x-ray lithography. None has yet emerged as the preferred choice.

It is widely recognized that the development of molecular electronics based on carbon nanotubes would enable logic devices to be built that have billions of transistors. Such computers would be orders of magnitude more powerful than today's machines. In order for this to become a reality, a method must be found to mass produce the molecular electronic devices. Scanning probe methods have proven feasible for fabricating single devices one nanotube at a time, but no way has been found yet to speed up the process sufficiently to make billions of transistors practical. Chemical based self-assembly processes have also been suggested, but so far, only the simplest structures have been built by use of this method. The problem of combining different materials and assembling molecular electronic devices with specific features remains a significant challenge. Therefore, it would be desirable to demonstrate the feasibility of cost-effectively fabricating carbon nanotube molecular electronic devices that have a nanosize diameter (e.g., 0.7-50 nanometers), micron-to-submicron-sized length (e.g., 100-1000 nanometers), and a gate structure that is a few nanometers long (e.g., 0.1-5 nanometers).

A nanotube or nanotube bundle/rope is typically much longer that 1 nanometer. Therefore, many inputs or junctions are needed along the length of each nanotube or nanotube rope to achieve desired nanoscale density. Nanotube junctions, or active nanotube junctions, are locations or points were nanotubes are in close proximity to each other and can be modified electrically.

Theoretical work by Chico et al., "Pure carbon nanoscale devices: nanotube heterojunctions," *Physical Review Letters,* 1996, has suggested that introducing pentagon-heptagon pair defects into otherwise hexagonal nanotube structure may create junctions between two topologically or electrically different nanotubes, as bases for nanoscale nanotube devices. S. Saito, "Carbon nanotubes for next generation electronic devices," *Science,* 1997, describes possible theoretical designs of a carbon nanotube that may function as a molecular electronic device. Those and other similar theoretical works outline the possibility to use carbon nanotubes as molecular devices, but fail to propose a design of such device and a method of its fabrication.

Collins et al., "Nanoscale electronic devices on carbon nanotubes," Fifth Foresight Conference on Molecular Nanotechnology, 1997, have demonstrated experimentally the rectification properties of single-wall carbon nanotubes. This work also fails to propose a design for carbon nanotube molecular electronic devices and a method of fabrication.

Therefore, in order to overcome current fabrication approaches that are expensive and impractical (e.g., placing individual nanotubes on a substrate with an atomic force microscope), a method is needed to mass produce carbon nanotube-based electronic devices in a manner that is efficient, cost-effective, and scalable.

BRIEF SUMMARY OF THE PRESENT INVENTION

The present invention is carbon nanotube-based electronic devices made by electrolytic deposition and applications thereof. The present invention includes nanotube-based electronic devices that are made by electrolytic deposition, such as, but not limited to, chemical or biological sensors, carbon nanotube field-effect transistors (CNFETs), tunnel junctions, Schottky junctions, and a two-dimensional array of nanotube junctions that is suitable for use as a building block in a signal processing application that requires high circuit density.

The present invention includes a novel method of fabricating single-wall nanotube devices that includes the combination of an electrolytic deposition process, followed by an operation to selectively "burn out" the percolated metallic nanotubes and, thereby, form a semiconducting nanotube-based electronic device.

Furthermore, the fabrication method of the present invention provides an efficient, cost-effective process for mass producing nanotube-based electronic devices that is scalable.

In a preferred embodiment, the present invention provides a device comprising at least one array of active carbon nanotube junctions deposited on at least one microelectronic substrate. In another preferred embodiment, the present invention provides a device comprising a substrate, at least one pair of electrodes disposed on the substrate, wherein one or more pairs of electrodes are connected to a power source, and a bundle of carbon nanotubes disposed between at least one pair of electrodes wherein said bundle consists essentially of semiconductive carbon nanotubes. In another embodiment, the bundle of carbon nanotubes consists of semiconductive carbon nanotubes and isolated metallic nanotubes. In another preferred embodiment, a semiconducting device formed by electrodeposition of carbon nanotubes between two electrodes is provided.

The invention also provides preferred methods of forming a semiconductive device by ramping a bias voltage across a single-wall carbon nanotube rope. The single-wall carbon nanotube rope preferably comprises a plurality of semiconducting single-wall carbon nanotubes and a plurality of metallic single-wall carbon nanotubes. The plurality of metallic single-wall carbon nanotubes are removed (e.g., by application of a bias voltage) in an amount sufficient to form the semiconducting device.

It is an object of the invention to provide electrical devices that are formed by carbon nanotube technology.

It is another object of this invention to provide an economic fabrication process for mass producing carbon nanotube electrical devices.

It is yet another object of this invention to provide increased circuit density, by use of carbon nanotube devices.

DETAILED DESCRIPTION OF THE INVENTION

Figure 1:
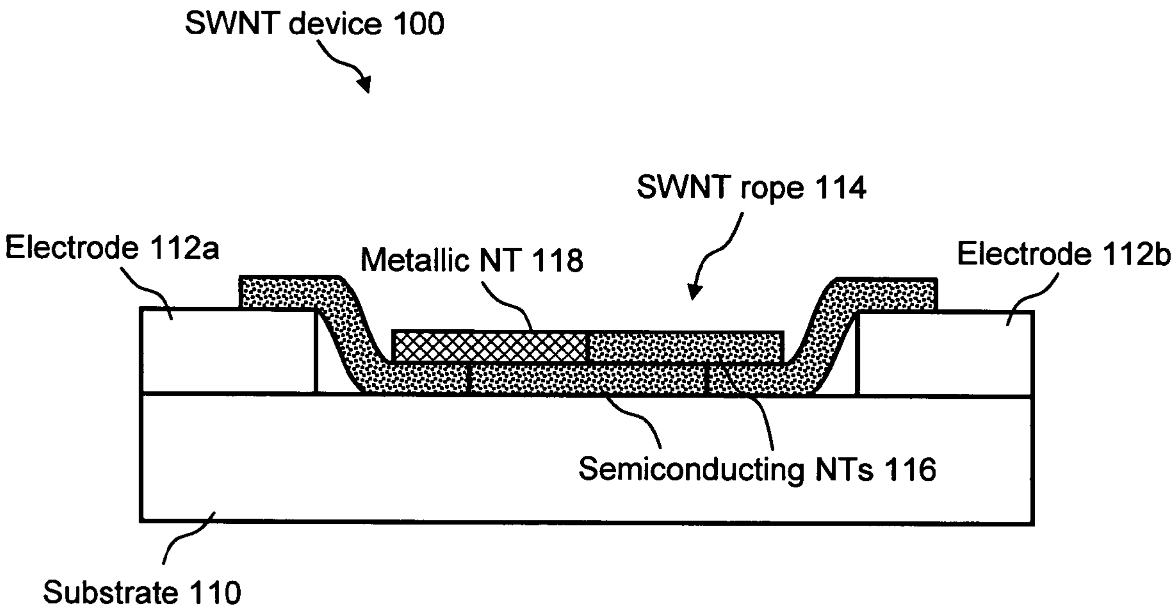
FIG. 1 illustrates a side view of a single-wall carbon nanotube device in its simplest form in accordance with an embodiment of the invention.

FIG. 1 illustrates a side view of a single-wall carbon nanotube (SWNT) device 100 (not drawn to scale) in its simplest form in accordance with a preferred embodiment of the invention. More specifically, the structure of SWNT device 100 includes a substrate 110, upon which is deposited a pair of electrodes 112, e.g., electrode 112*a* and electrode 112*b*. Additionally, an SWNT rope 114 is deposited upon substrate 110 between electrode 112*a* and electrode 112*b* and electrically connected thereto. SWNT rope 114 can be formed from a mixture of semiconducting nanotubes (NTs) 116 and isolated metallic NTs, such as metallic NT 118. Semiconducting nanotubes NTs 116 are carbon nanotubes that exhibit typical semiconductor current-voltage behavior and metallic NTs 118 are carbon nanotubes that exhibit ohmic current-voltage behavior. Single nanotubes which are semiconductive can also be used to form this device.

Substrate 110 can be formed from any electrically non-conductive material that is commonly used in semiconductor manufacturing, such as silicon nitride (SiN), silicon dioxide ($SiO_2$), and silicon (Si). Electrode 112*a* and electrode 112*b* can be formed from an electrically conductive material, such as gold (Au) and serve as the electrical contacts for the SWNT device 100. Electrodes 112 have a thickness of, for example, between about 0.1 and 50 microns and a width of, for example, between about 0.5 and 75 microns; however, the width of electrode 112 where SWNT rope 114 is in contact therewith can be ~0.3 microns. The spacing between electrodes 112*a* and 112*b* is, for example but not limited to, between about 0.5 and 75 microns.

SWNT rope 114 can be a bundle of individual semiconducting SWNTs arranged in a rope-like structure spanning electrode 112*a* and electrode 112*b*. The semiconducting SWNTs that form SWNT rope 114 are arranged in parallel and in contact with another. The outer diameter of the SWNTs that form SWNT rope 114 ranges from about 0.7 to 3 nanometers, and the SWNTs can be up to a few microns in length. The overall diameter of SWNT rope 114 is, for example, between about 0.7 and 500 nanometers. SWNT rope 114 can formed by an electro-deposition process, which is described in more detail in reference to FIG. 2.

With continuing reference to FIG. 1, SWNT device 100 is representative of an electrical device in its simplest form, made by use of SWNTs. For example, because carbon nanotubes are inherently photosensitive, SWNT device 100, in one embodiment, is suitable for use as a photodetector (or photodiode). In operation, current flow is induced within SWNT rope 114, by applying a voltage differential between electrode 112*a* and electrode 112*b* or by exposing SWNT device 100 to a light source. When the light source is removed, the current flow through SWNT device 100 ceases. The photosensitivity can be exploited, for example, to make the nanotube device part of an optical circuit.

Figure 2:
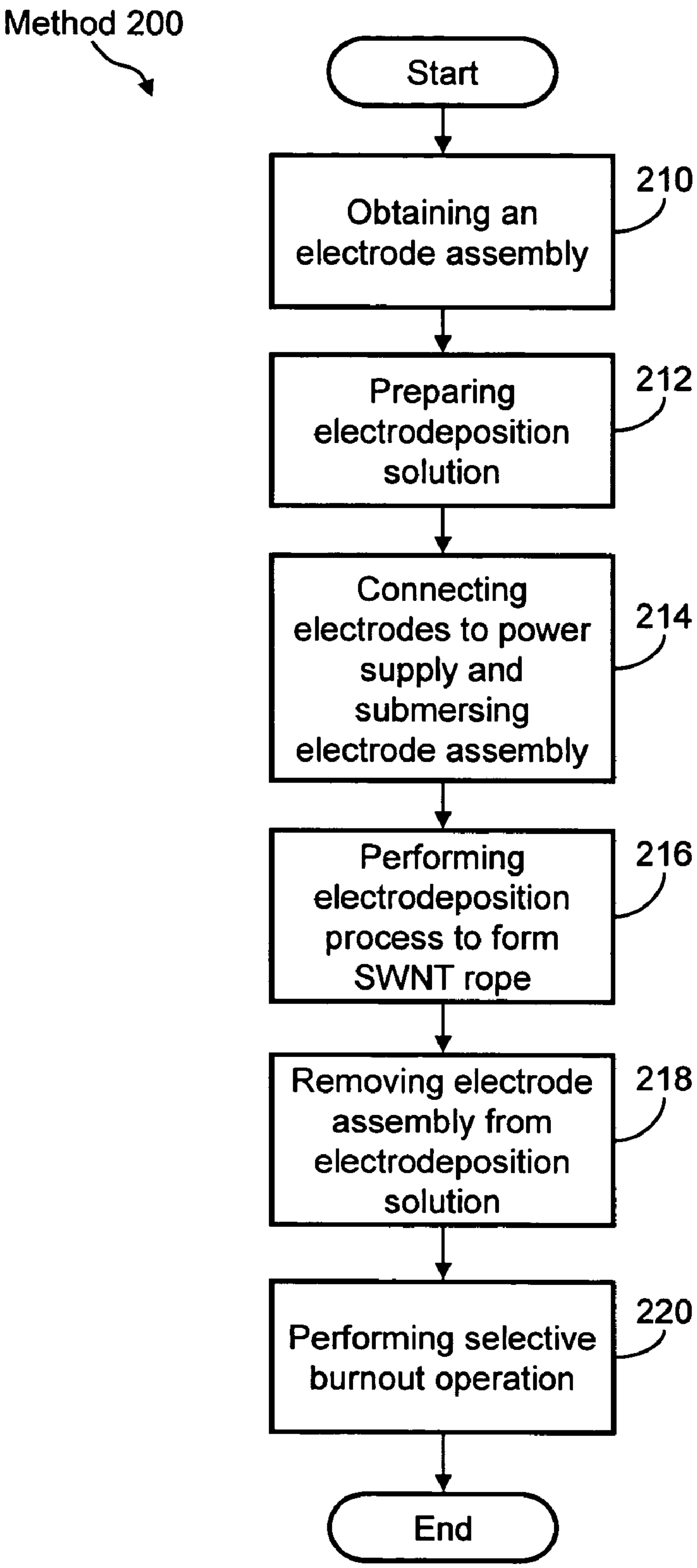
FIG. 2 is a flow diagram of an exemplary method of cost-effectively mass producing semiconducting single-wall carbon nanotube devices, by use of electrolytic deposition, in combination with a "burn out" operation.

FIG. 2 is a flow diagram of a method 200 of cost-effectively mass producing semiconducting SWNT devices, such as SWNT device 100, by use of electrolytic deposition in combination with a selective "burn out" operation. The selective burn out operation is preferred, because the electrodeposition solution includes a mixture of metallic, semi-metallic, and semi-conductive SWNTs. In order to produce a semiconducting device, in accordance with an embodiment of the invention, the metallic SWNTs, which are highly conductive, are selectively removed.

Method 200 is a preferred method of producing semiconducting SWNT devices combining an SWNT fabrication process and a selective "burn out" operation. A preferred fabrication process by P. Jaynes, T. Tiano, M. Roylance, C. Carey and K. McElrath, "Alignment and Deposition of Single Wall Carbon Nanotubes under the Influence of an Electric Field," in "Nano- and Microelectromechanical Systems (NEMS and MEMS) and Molecular Machines," Eds. D. A. LaVan, A. A. Ayon, T. E. Buchheit, and M. J. Madou, *MRS Proceedings* vol. 741, (2003) pp. J8.5.1-J8.5.6 (incorporated herein by reference in its entirety) is summarized with reference to steps 210 through 218 of method 200. The step of selectively burning out the metallic SWNTs is described with reference to step 220 of method 200 and FIGS. 3A, 3B, 3C, and 3D. In the event that the electrodeposition solution includes only semi-conductive SWNTs, the selective burn out operation of step 220 is not required.

With reference to method 200, the variables that contribute to the ability to align SWNTs in an electric field include, for example, SWNT suspension concentration, deposition time, electric field intensity (voltage, V), electric field frequency (MHz), and electrode design (shape, line widths, and spaces).

At step 210, method 200 first includes obtaining an electrode assembly. The electrode assembly, such as a planar electrode assembly, includes a substrate (e.g., substrate 110 of FIG. 1) having a plurality of electrode pairs (e.g., electrodes 112*a* and 112*b* of FIG. 1, formed thereon, by any conventional means, in a predetermined pattern. The line width and spacing of electrodes can be, for example, between about 0.15 and 75 microns.

In one embodiment, the degree of dispersion of the nanotubes (e.g., the length of the nanotube rope, ranging between a single nanotube to ropes consisting of hundreds of nanotubes) can be varied by changing the time of insonification, by varying the amplitude of the acoustic excitation, or by the choice of the fluid in which the nanotubes are dispersed. Fluids which wet the nanotubes increase the degree of dispersion by reducing the tendency of the nanotubes to recombine. The degree of dispersion depends on the surface energy of the solvent and that of the nanotube as measured, for example, by inverse chromatography. Dispersion can also be controlled by functionalization of the nanotube or nanotube rope (e.g., chemically attaching molecules to the nanotube aggregates).

The concentration of nanotubes can be important in controlling the dispersion of nanotubes. The recombination of nanotubes in nanotube linear bundles into larger agglomerates is directly proportional to the concentration of linear nanotube bundles squared. In one embodiment, concentrations of nanotubes can range from $10^{-4}$ gm linear nanotube ropes per cc solvent for chemically modified nanotubes to $10^{-8}$ gm/cc to obtain single nanotubes with useful suspension times.

Dispersion can be used to control the tendency of nanotubes form three dimensional aggregates. Nanotubes have a tendency to form three dimensional aggregates because they are smooth on the nanometer scale and therefore have very large van Der Waals forces that make them stick together. Strategies to break the three-dimensional aggregates can be used to suspend linear aggregates of nanotubes in solution. In one embodiment, electrophoresis of linear aggregates starts from a solution of linear aggregates of nanotubes.

Ultrasonic dispersion is the most general method for making a solution of linear aggregates of nanotubes. Such a solution is an inherently non-equilibrium (unstable) state. The rate of break-up of the nanotube agglomerates is proportional to the acoustic energy applied to the solution. The rate of recombination is proportional to the nth power of the concentration where n=2 or somewhat greater. Therefore, in one embodiment, continuous insonification is applied. Alternatively, dispersion can be achieved without continuous insonification in a solution sufficiently dilute to avoid recombination of nanotube aggregates during the deposition time period.

At step 212, SWNTs are dispersed in a solution of organic solvent, such as ethanol, to form the electrodeposition solution. In one example, the SWNT suspension concentration is $5.059\times10^{-7}$ gm/cc. Dispersion is performed by use of high amplitude ultrasonic energy, in order to achieve highly dispersed SWNT suspensions in polar organic solvents. In this example, the dispersion apparatus is a Branson titanium wedge tip ultrasonic welding horn and a Branson 940B power supply. An example of the dispersion apparatus settings is frequency=40 kHz, amplitude gain=2:1, power=700 W continuous, amplitude=45% maximum. The electrodeposition solution can be prepared by the addition of the SWNTs to the solvent and sonicating them for a period of, for example, 30 minutes. The electrodeposition solution includes a mixture of metallic, semi-metallic, and semi-conductive SWNTs.

At step 214, the electrode pairs of the electrode assembly are electrically connected to the power supply and the planar electrode assembly is submersed in the electrodeposition solution, by suspending them therein.

At step 216, the power supply that is connected to electrodes 112 is activated and, thus, an electrodeposition process is performed to form an SWNT rope therebetween, such as SWNT rope 114 of FIG. 1, across substrate 110 between electrodes 112*a* and 112*b* of FIG. 1. For example, an electrodeposition process is performed by the application of an AC electric field intensity of 5 to 30 volts, with a frequency of 5 MHz, to electrodes 112 for a period of 10 to 105 minutes. In the presence of this electric field, the SWNTs migrate out of solution to the source of the field. A dipole is generated in the presence of the electric field on the surface of each SWNT, which causes the SWNTs to orient in the direction of the field as it is being deposited. The width and placement of single nanotubes or SWNT ropes depends on the electrode geometry, while the volume of SWNT deposited is dependent on the time of deposition. Accordingly, the resistance across the electrodes decreases as the deposition time, and hence the number of SWNT bridges, increases. The electrodeposition process may be monitored in real time, by use of standard instrumentation to measure the resistance across electrodes 112.

At step 218, the power supply is deactivated, and the electrode assembly that has a plurality of deposited SWNT devices, such as SWNT device 100, formed thereon is removed from the electrodeposition solution.

At step 220, the metallic SWNTs within the SWNT rope, such as SWNT rope 114, are selectively burned out along the percolation paths therein, in order to produce a semiconducting device. The selective burn out operation is performed by ramping a bias voltage from, for example, about −1.0 to +1.0 volts across the two electrodes, such as electrodes 112*a* and 112*b*, and the resulting current flow performs a bulk burn out of the conductive metallic SWNTs, so as to produce a semiconducting device. The voltage can be ramped over a period of, for example, about 0.1 to 5 seconds. The process and result are illustrated, for example, in reference to FIGS. 3A, 3B, 3C, and 3D. Preferably, the bias voltage removes metallic SWNTs within the SWNT rope in an amount sufficient to form a semiconducting device (e.g., the burnout process leaves no continuous metallic SWNT paths between the electrodes). For example, in one embodiment, isolated metallic SWNTs may be present in the semiconducting device (e.g., along non-percolation paths) after application of the electric field. The removal of continuous metallic SWNT pathways is preferred in order to achieve the desired semiconducting device behavior.

In this embodiment of the invention, the carbon nanotubes of the resulting semiconducting device preferably consist essentially of semiconductive carbon nanotubes. The term "consisting essentially of" includes materials that those that do not materially affect the basic and novel characteristics of the semiconducting device. For example, the presence of an electrically isolated metallic carbon nanotube would not materially affect the semiconducting properties of the device.

Figure 3A:
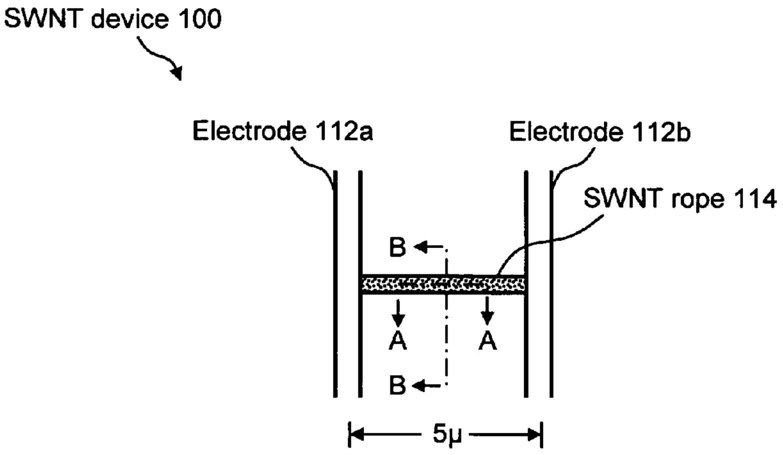
FIG. 3A illustrates a top view of a single-wall carbon nanotube device, formed by the exemplary method of FIG. 2.

FIG. 3A illustrates a top view of, for example, SWNT device 100, which is formed by steps 210 through 218 of method 200. FIG. 3A shows a length of SWNT rope 114 bridging electrodes 112a and 112b, which are spaced, for example, 5 microns apart.

Figure 3B:
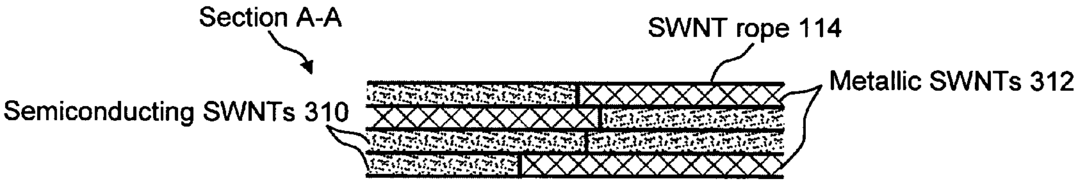
FIG. 3B illustrates a cross sectional view of a single-wall carbon nanotube rope, taken along line A-A of FIG. 3A, prior to its experiencing the burn out operation in accordance with an embodiment of the invention.

FIG. 3B illustrates a cross sectional view of SWNT rope 114, taken along line A-A of FIG. 3A, prior to its experiencing the burn out operation of step 220. This view shows that SWNT rope 114 further includes a plurality of semiconducting SWNTs 310 and a plurality of metallic SWNTs 312, which are oriented in parallel and in contact with one another. The length to diameter ratio of the SWNTs is approximately 1000:1.

Figure 3C:
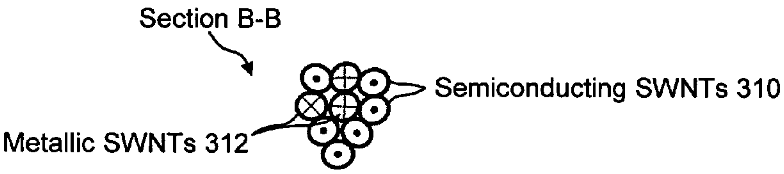
FIG. 3C illustrates a cross sectional view of the single-wall carbon nanotube rope, taken along line B-B of FIG. 3A, prior to its experiencing the burn out operation in accordance with an embodiment of the invention.

FIG. 3C illustrates a cross sectional view of SWNT rope 114, taken along line B-B of FIG. 3A, prior to its experiencing the burn out operation of step 220.

Figure 3D:
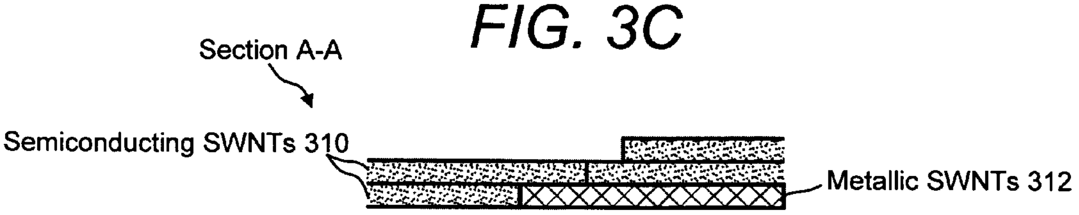
FIG. 3D illustrates a cross sectional view of the single-wall carbon nanotube rope, taken along line A-A of FIG. 3A, after it has experienced the burn out operation in accordance with an embodiment of the invention.

FIG. 3D illustrates a cross sectional view of SWNT rope 114, taken along line A-A of FIG. 3A after experiencing the burn out operation of step 220. This view shows that metallic SWNTs 312 along the percolation paths of SWNT rope 114 are removed by the bulk burn out operation, which leaves only semiconducting SWNTs 310 and isolated metallic SWNTs 312.

With reference to FIGS. 1, 2, 3A, 3B, 3C, and 3D, the ability to deposit and align nanotubes under the influence of an electric field is an enabling processing technology that demonstrates the ability to manipulate nanomaterials by use of standard macroscopic technology to perform bulk alignment of single nanotubes or SWNT ropes. The fabrication process of method 200 is scalable for cost-effective mass production of materials and devices, based on SWNTs. These devices could include, for example, nanocomposites that have directional conductivity or strength and nanoelectronic circuits and devices. Additional post-processing steps beyond those described in method 200 of FIG. 2 allow the formation of various carbon nanotube electrical devices for use in a variety of applications, such as, but not limited to, a photodetector, a chemical or biological sensor, a carbon nanotube field-effect transistor, and a two-dimensional array of nanotube junctions that is suitable for use as a building block in a signal processing application requiring high circuit density. Examples of such devices are provided in reference to FIGS. 4 through 9B.

Figure 4:
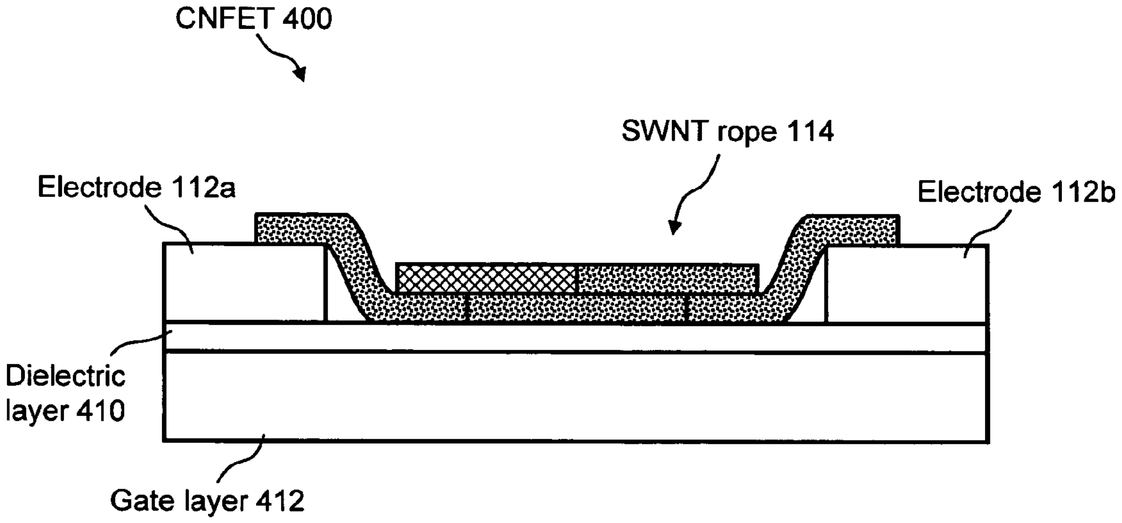
FIG. 4 illustrates a side view of a carbon nanotube field-effect transistor in accordance with an embodiment of the invention.

FIG. 4 illustrates a side view of an exemplary carbon nanotube field-effect transistor (CNFET) 400 in accordance with an embodiment of the invention. Similar to SWNT device 100, CNFET 400 includes SWNT rope 114 spanning electrodes 112a and 112b, which are deposited atop a dielectric layer 410, which is deposited atop a gate layer 412, as shown in FIG. 4.

Dielectric layer 410 can be formed of an insulating material, such as silicon dioxide (SiO2) or SiN, as is commonly used in semiconductor manufacture, that has a thickness up to, for example, about 150 nanometers. Gate layer 412 is formed of doped silicon and has a standard wafer. Doping in this case is the deliberate introduction of specific impurity atoms into semiconductor crystal lattice, in order to change its electrical properties. In this example, electrodes 112a and 112b form the source and drain of CNFET 400, while an electrical connection (not shown) to gate layer 412 forms the gate. In the example of FIG. 4, CNFET 400 is a back-gated device; however, a front- or side-gated device may also be formed. CNFET 400 operates in the conventional manner, whereby a voltage differential is applied across the source and drain (i.e., electrodes 112a and 112b) and CNFET 400 acts like a switch that is turned on or off by the control of the voltage at the gate, i.e., gate layer 412.

In another embodiment of the invention, multiple nansocale junctions (e.g., 0.7 to 100 nm feature size, densely spaced (10-1000 nm on center separation)) can be formed along the length of linear nanotube aggregates and embedded in a conventional micro electronic circuit or a chip using electrophoresis. For example, circuits can be made in this manner having nanometer feature size using standard lithography. In this example, conventional lithography is used to make a standard micro electronic circuits and the electrode arrays which guide the electrophoretic deposition of the nanotubes. Conventional electronics made in this example can be sealed, the chip can be placed in a electrophoresis bath, and nanotubes can be deposited in accordance with the invention to implement nanoscale circuits.

Figure 9A:
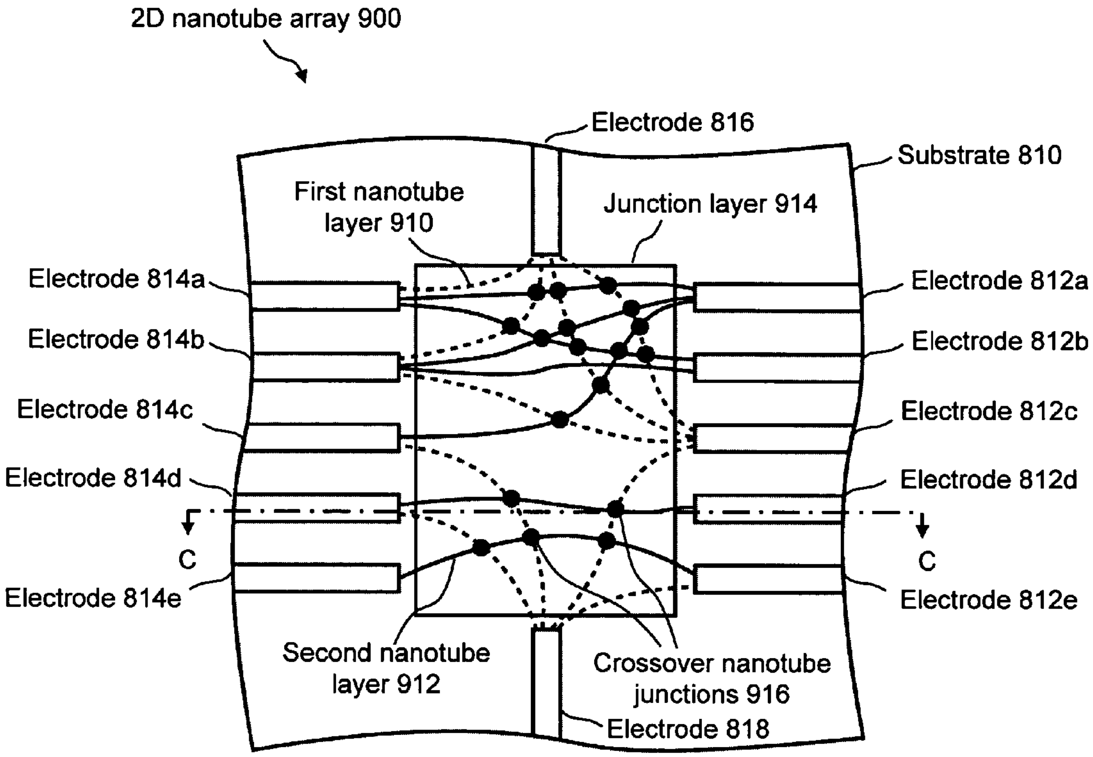
FIG. 9A illustrates a top view of a two-dimensional nanotube array that has a junction layer in accordance with an embodiment of the invention.

In another embodiment, nanotube devices can be formed on the deposited linear nanotube aggregates by self assembly of electrically active molecules. For example, the biological sensors described herein can be formed in this manner. Alternatively, a two dimensional or multi-dimensional array of electrodes can be formed from deposited linear nanotube aggregations which contact at each other at steep angles (e.g., crossing or contacting at right angles). As illustrated in FIGS. 9A and 9C, overlap of linear nanotube aggregates at right angles can form electrical junctions which can be used to fabricate active nano-devices.

In another embodiment, a two-dimensional or multi-dimensional array of electrodes can be excited one pair at a time. In this manner, a linear nanotube aggregate can be deposited to connect the excited pair of electrodes. In this example, the deposited linear nanotube aggregates can be metallic (having continuous metallic paths connecting the electrodes), semiconducting (having no continuous metallic paths connecting the electrodes), or may be single metallic or semiconducting nanotubes.

In another embodiment, the selection of a pair of electrodes to bridged and the application of burnout voltages may be applied automatically (e.g., under computer control). Automating this exemplary process permits large numbers of nanotubes to be deposited. As the number of nanotubes bridging the space between the electrodes increases, the bridging of the next pair of electrodes creates a larger and larger number of junctions. The computer driven electrophoretic deposition therefore provides an efficient process for manufacturing nano-scale device circuits. Once an array of nanotube bridges are deposited, a planar film of some appropriate microelectronic material can be deposited on the nanotube and the electrodes can be used to deposit and contact the nanotubes. Another layer of nanotube can then be deposited on top of the first film. Thus, in this embodiment of the invention, three-dimensional arrays of nanotube devices can be fabricated.

Figure 5A:
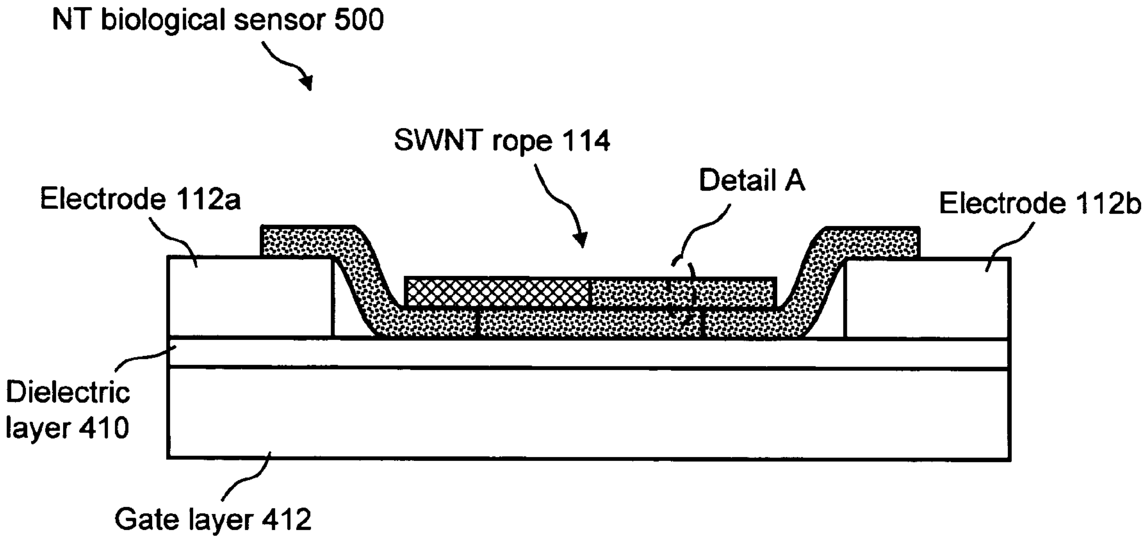
FIG. 5A illustrates a side view of a nanotube biological sensor in accordance with an embodiment of the invention.

FIG. 5A depicts another exemplary carbon nanotube electrical device. FIG. 5A illustrates a side view of an NT biological sensor 500 in accordance with an embodiment of the invention. NT biological sensor 500 is a FET that is functionalized with a biological or chemical receptor. The side walls of a nanotube bundle forming a biological sensor, such as NT biological sensor 500, may be modified with receptors for various threat materials, such as botulinum neurotoxin (BoNT), anthrax, and ricin.

Figure 5B:
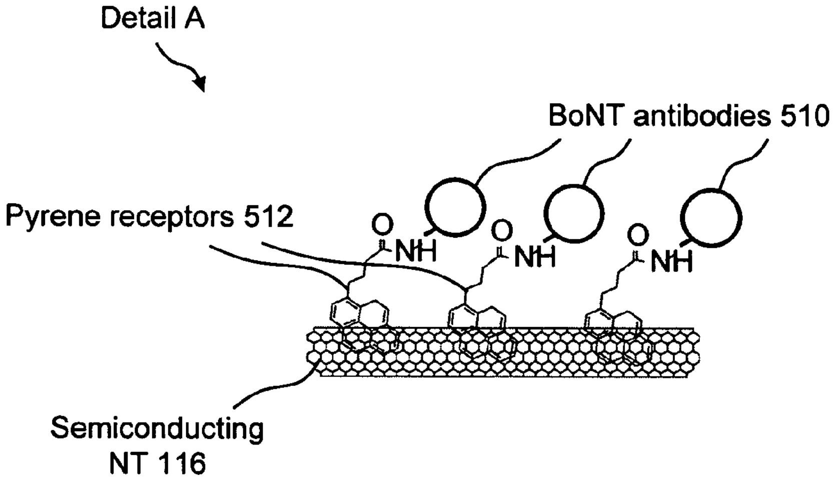
FIG. 5B illustrates an expanded view of Detail A of FIG. 5A.

NT biological sensor 500 of FIG. 5A is but one example. More specifically, NT biological sensor 500 is a back-gated FET that is functionalized with a BoNT receptor. NT biological sensor 500 includes SWNT rope 114 spanning electrodes 112*a* and 112*b*, dielectric layer 410, and gate layer 412, as described in reference to FIGS. 1 through 4. However, in this example, SWNT rope 114 is chemically modified, in order to be functionalized as a biosensor device. Accordingly and as shown in FIG. 5B that illustrates an expanded view of Detail A of FIG. 5A, NT biological sensor 500 of FIGS. 5A and 5B further includes one or more BoNT antibodies 510 that are attached along the length of SWNT rope 114, via one or more pyrene receptors 512, respectively. In this example, BoNT antibodies 510 are the BoNT sensing elements of NT biological sensor 500. NT biological sensor 500 provides the advantage of including multiple antigens along a single nanotube rope that has a length of only 1 micron.

The exemplary operation of a biosensor, such as NT biological sensor 500, is described as follows. A biosensor of a given functional group has a certain electronic conductivity between its electrodes. When the toxin for which the FET is functionalized binds to the SWNT rope (e.g., BoNT binding to its receptor), the electronegativity of the toxin withdraws electrons from the active region of the device and thereby changing the electrical response of the biosensor. The change in electrical response can be detected by measurement of its current or voltage, via electrodes 112. For example, if the biosensor is a depletion device, when electrons are drawn out of the toxin (e.g., BoNT), an increase in the resistance of SWNT rope 114 is detected. Example methods of attaching the BoNT sensing element to the SWNT for forming a BoNT biosensor, such as NT biological sensor 500, are provided below.

A method of attaching the BoNT sensing element, e.g., BoNT antibodies 510, to the SWNT, (e.g., SWNT rope 114), can be through non-covalent binding of pyrene-modified BoNT receptors, e.g., pyrene receptors 512, to its surface. The specific details for chemically attaching pyrene to the BoNT antibody and GT1b, the natural receptor for BoNT, are described in more detail in reference to FIGS. 6 and 7.

Binding of the modified pyrene to the carbon nanotube surface can be performed by exposing the SWNTs to a solution containing the modified pyrene for 24 hours at room temperature. Unreacted material is removed by rinsing with water. Attachment to the SWNTs can be confirmed by use of optical and microscopic techniques, such as Raman, fluorescence, near-field scanning microscopy, atomic force microscopy (AFM), and transmission electron microscopy (TEM). In addition, nuclear magnetic resonance (NMR) spectroscopy can be used to determine the conformation of the BoNT receptor attached to carbon nanotubes.

Figure 6:
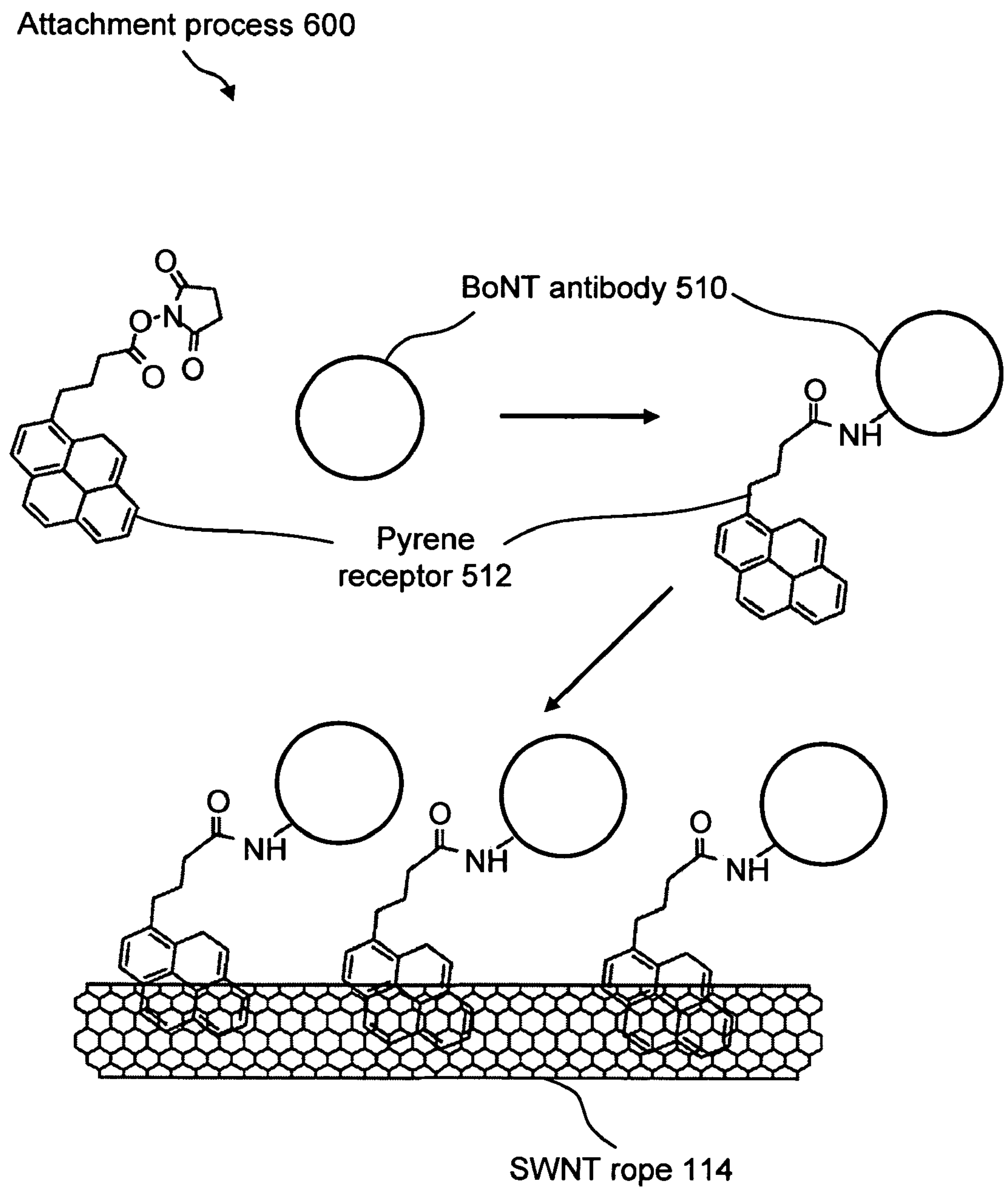
FIG. 6 illustrates an exemplary attachment process of attaching anti-BoNT to pyrene and, subsequently, to the single-wall carbon nanotube.

FIG. 6 illustrates an exemplary attachment process 600 for attaching anti-BoNT to pyrene and, subsequently, to the SWNT. The approach to covalently attaching the antibody to the pyrene relies on well-established procedures for tagging antibodies with fluorophores. Pyrenebutanoic acid succinimidyl ester (Pyr-NHS), a commercially available chemical, is incubated with polyclonal rabbit anti-BoNT-A antibodies in an appropriate buffer solution. This forms an amide bond with the amine groups that are commonly found in antibodies and, thus, the pyrene attaches to the antibody (e.g., pyrene receptor 512 attaches to BoNT antibody 510), as shown in FIG. 6.

Figure 7:
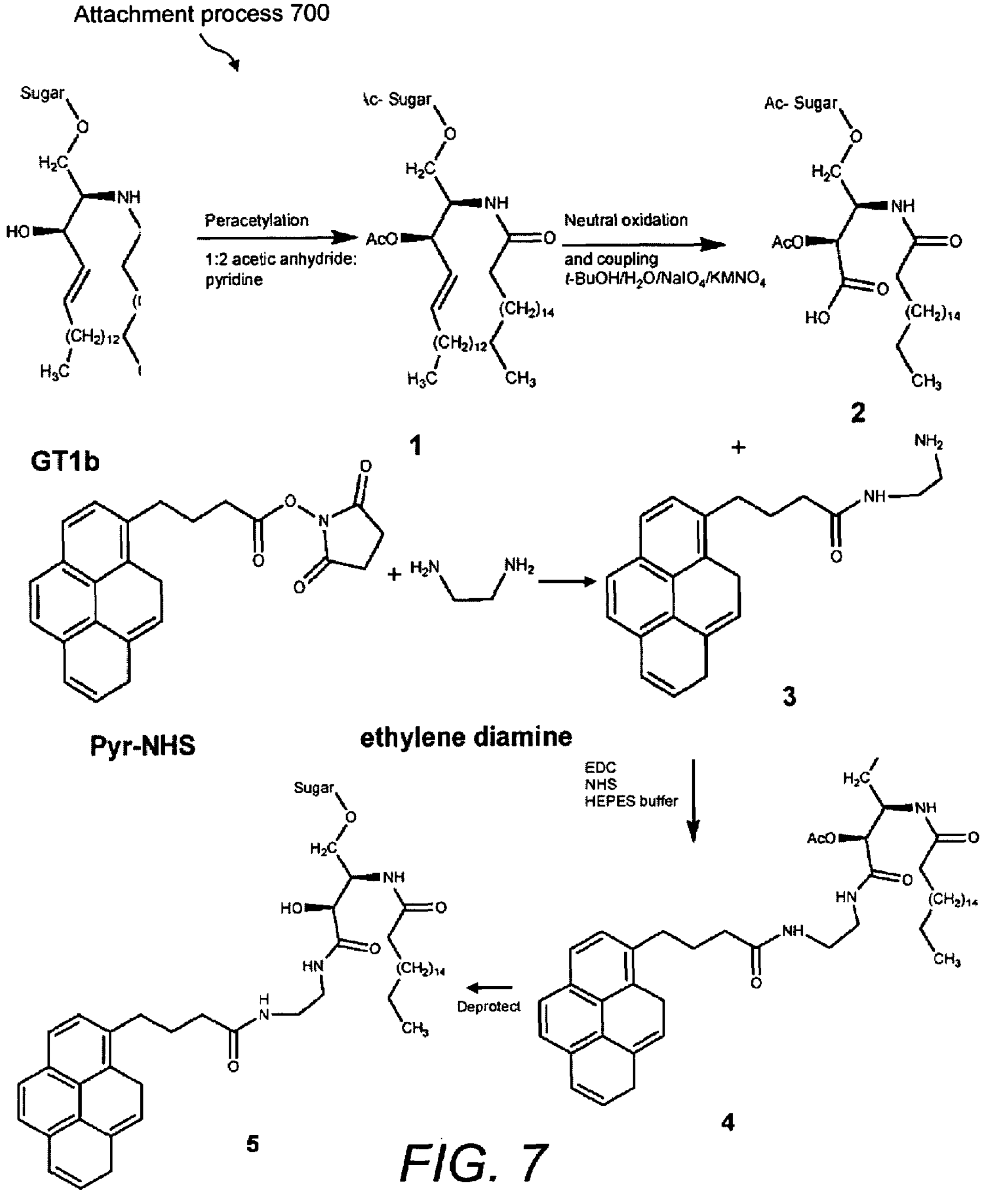
FIG. 7 illustrates an exemplary attachment process of attaching GT1b to pyrene.

FIG. 7 illustrates an exemplary attachment process 700 for attaching GT1b to pyrene. The trisialoganglioside GT1b is the natural binding receptor for BoNT. This receptor is suitable to be chemically attached to a SWNT, because the binding characteristics of the heavy chain and the GT1b molecule demonstrate exceedingly high binding affinities, with little dissociation between the BoNT molecule and the binding site. An advantage of using the natural receptor to BoNT is that it assures that the antigen detected actually interferes with normal biological functions. The synthetic strategy described herein, while very specific to BoNT, is easily modified, so that a wide variety of antibody-based and peptide-based sensors may be prepared.

First, protection of the hydroxyl group of GT1b is accomplished by the addition of a 1:2 mixture of acetic anhydride and pyridine dried GT1b. Oxidization of the sphingosine double bond of process step 1 of FIG. 7 is done under neutral oxidation conditions that use t-BuOH/H2O/NaIO4/KMnO4. This method is effective in cleaving the sphingosine double bond in peracetylated glycosphingolipids. It should be noted that removal of the sphingosine chain does not adversely affect the binding properties of GT1b. After the reaction is complete, the unreacted oxidant is quenched, and the modified ganglioside is extracted with ether, which gives the compound that is shown in process step 2 of FIG. 7.

Attaching pyrene to GT1b begins with 1-pyrenebutanoic acid, succinimidyl ester (Pyr-NHS), which is converted to a terminal amine functionalized compound, by its reacting with an aqueous 5% ethylene diamine solution. Coupling of the amino functionalized pyrene, as shown in process step 3 of FIG. 7, to the compound shown in process step 2 of FIG. 7 is accomplished by use of the carboxylate reactive 1-ethyl-3-[3-dimethylaminopropyl]carbodiimide (EDC) and N-hydroxysulfosuccinimide (NHS), which results in the compound shown in process step 4 of FIG. 7. Finally, deprotection of the hydroxyl groups can be accomplished by addition of triethylamine, which results in the compound shown in process step 5 of FIG. 7. GT1b attachment to the pyrene can be determined by use of optical and microscopic techniques.

Attachment process 700 of attaching GT1b to pyrene, as shown in the exemplary method depicted in FIG. 7, is summarized as follows.

Process step 1: protecting the hydroxyl group of GT1b;

Process step 2: oxidizing the double bond to a carboxylic acid;

Process step 3: reacting the result of process step 2 with EDC, in order to produce an N-succinimide ester intermediate;

Process step 4: reacting the N-succinimide ester intermediate with the amine-functionalized pyrene; and Process step 5: deprotecting the hydroxyl.

An alternative method of attaching the BoNT sensing element to the SWNT is based on a covalent tether. The method involves functionalizing the sidewalls of the SWNTs with amine linkages. The amine-functionalized SWNT is the starting material for bonding both the antibody and the GT1b receptor. For the GT1b, the receptor is reacted with the amine-functionalized SWNT, by use of the same procedure described for reacting it with pyreneamine, as described in reference to FIGS. 6 and 7. More specifically, in order to accomplish bonding to the antibody, the amino groups of the amine-functionalized SWNT can be reacted with the hetero-bifunctional cross-linker Sulfo-SMCC in a coupling buffer that results in a maleimide-activated surface that is able to react with sulfhydryl groups on antibodies and other proteins. The antibodies are either partially reduced to produce sulfhydryls for coupling, or sulfhydryl groups are added to the antibody for coupling to the SWNT by use of standard literature procedures.

Figure 8A:
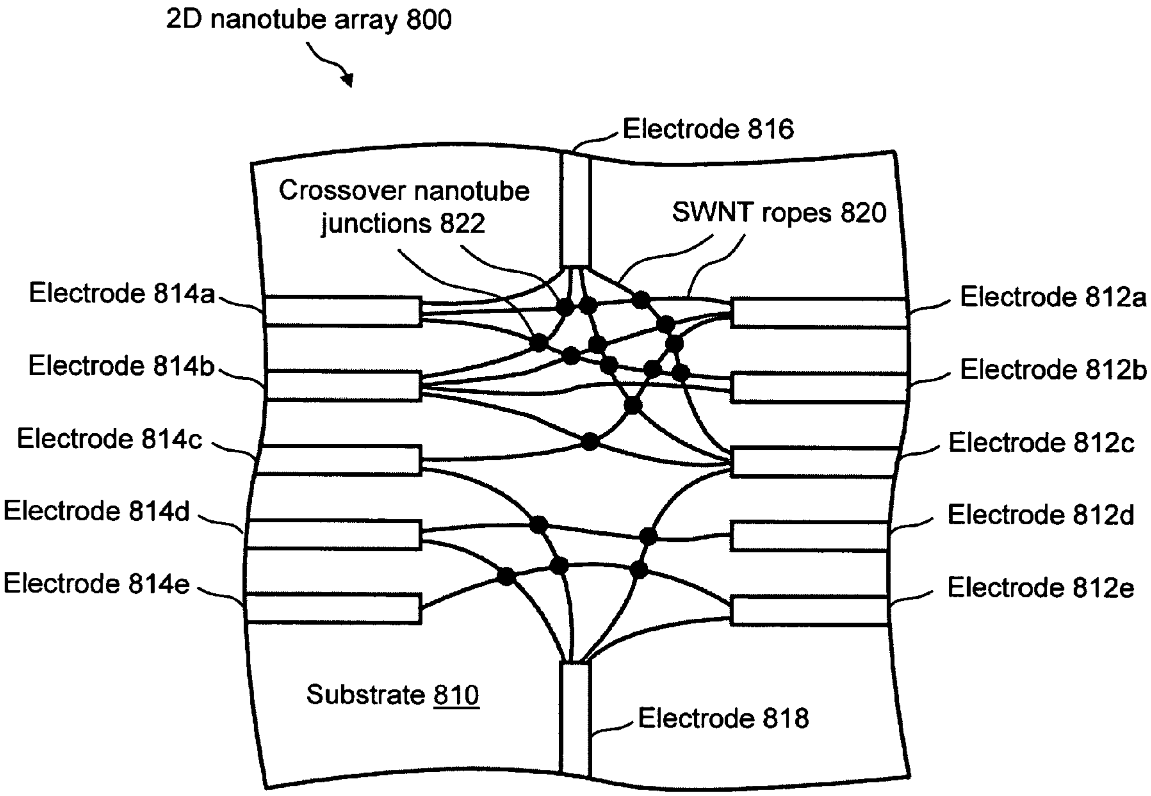
FIG. 8A illustrates a top view of a two-dimensional nanotube array in accordance with an embodiment of the invention.

In yet another example of a carbon nanotube electrical device, FIG. 8A illustrates a top view of a two-dimensional (2D) nanotube array 800 in accordance with an embodiment of the invention. 2D nanotube array 800 is representative of an example nanotube microelectronic device that is formed by the electrodeposition process of method 200 of FIG. 2 and that is suitable for use as a building block in a signal processing application that requires high circuit density. 2D nanotube array 800 includes a substrate 810, a plurality of electrodes 812, a plurality of electrodes 814, an electrode 816, an electrode 818, a plurality of single nanotubes or SWNT ropes 820, and a plurality of crossover nanotube junctions 822 that are formed at the intersections of single nanotubes or SWNT ropes 820. More specifically, a set of parallel-arranged electrodes 812*a*, 812*b*, 812*c*, 812*d*, and 812*e* are arranged opposite a set of parallel-arranged electrodes 814*a*, 814*b*, 814*c*, 814*d*, and 814*e*, and electrode 816 is arranged opposite electrode 818. Electrode 816 and electrode 818 are orthogonal to electrodes 812 and electrodes 814 and centered therebetween. The arrangement of electrodes shown in FIG. 8A is but one example. Any user-defined pattern is possible. In accordance with a preferred embodiment of the invention, an array or arrays of active junctions of nanotubes (e.g., linear agglomerations of nanotubes) can be deposited on any suitable substrate (e.g., microelectronic substrate).

Electrodes 812, electrodes 814, electrode 816, and electrode 818 are, for example, 0.5 μm metal lines that are formed of an electrically conductive material, such as gold, and that are deposited atop substrate 810 by any conventional process. The spacing between opposite electrodes, such as electrode 812*a* and 814*a* or electrode 816 and 818, can be, for example, between about 0.5 and 75 microns. Substrate 810 is formed of any electrically non-conductive material that is commonly used in semiconductor manufacturing, such as SiN, SiO, and Si. Alternatively, substrate 810 is a flexible substrate that is formed of, for example, plastic, liquid crystal polymer films, or polyimide.

Single nanotubes or SWNT ropes 820 are as described in reference to SWNT rope 114 of FIG. 1. Single nanotubes or SWNT ropes 820 are formed by use of the electrolytic deposition process that is described in reference to method 200 of FIG. 2. During the electrolytic deposition process, crossover nanotube junctions 822 are formed at the intersections of single nanotubes or SWNT ropes 820. More specifically, 2D nanotube array 800 can be formed by applying a voltage potential between two electrodes, in order to create nanotube bridging between the electrodes, such as between electrode 812*a* and electrode 814*c*, or between electrode 818 and electrode 814*d*. This process is repeated, until each electrode is electrically connected to each of the other electrodes by crossover nanotube junctions 822. For example, this can be done automatically by the placement of a probe on each of the electrodes and exciting them in pairs. 2D nanotube array 800 is representative of the beginning of a nanotube circuit that has junction density on the nano-scale that uses only 0.5 μm lithography. Once 2D nanotube array 800 is deposited, it may serve as a basis for self-assembly of other nanostructures that interact with the single nanotubes or SWNT ropes 820, such as quantum-dots. Quantum-dots are small (less than 50 nanometers) dots of multilayer materials which can be self assembled on the junction layer to interact with nanotubes electrically or optically.

2D nanotube array 800, which can be formed by use of method 200, is representative of a method of creating nano-scale arrays of electronic devices, such as memory arrays, from nanotubes, in a manner that is much more scalable, practical, and efficient than current approaches that involve placing individual nanotubes on a substrate with an atomic force microscope. 2D nanotube array 800, formed by use of method 200, takes advantage of the high aspect ratio of nanotubes, as compared to other nano-particles. The average length of SWNTs is 1 μm, and they form single nanotubes or SWNT ropes that can be, for example, several nanometers wide and 5 micrometers long. In another embodiment, multidimensional arrays can be formed having multiple layers of nanotubes arranged, for example, in nanotube bundle or rope structures.

Figure 8B:
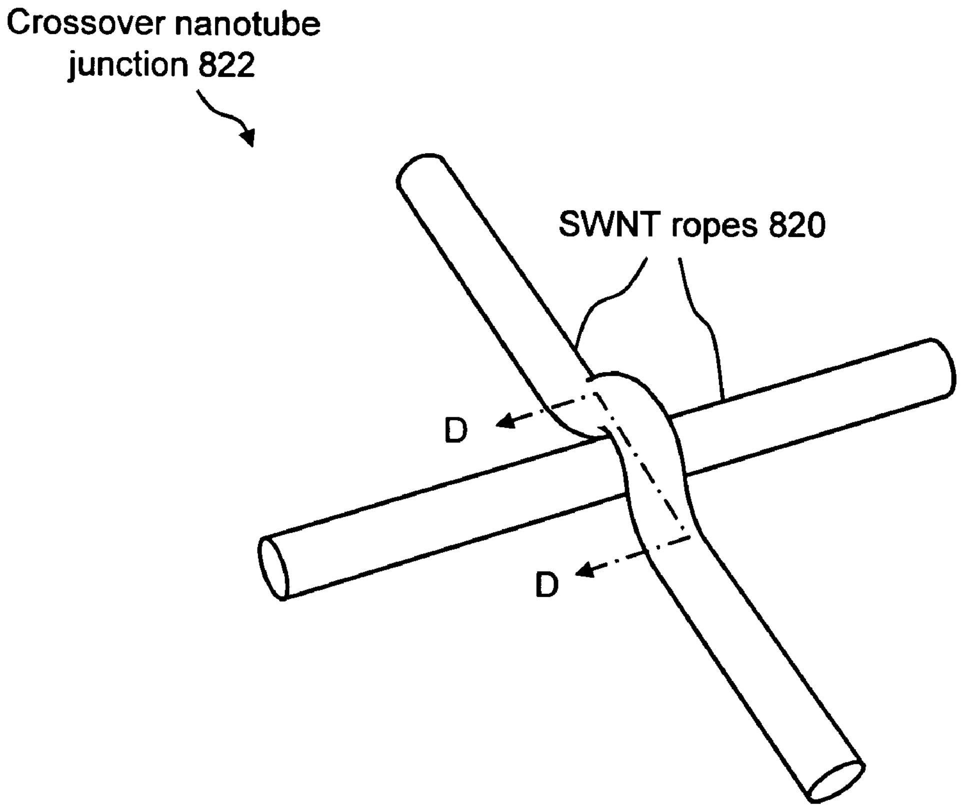
FIG. 8B illustrates an expanded view of a crossover nanotube junction in accordance with an embodiment of the invention.

FIG. 8B illustrates an expanded view of crossover nanotube junction 822 in accordance with the invention. Crossover nanotube junctions are junctions that form when two nanotubes (or SWNT ropes) are induced to cross at a steep angle that approaches 90 degrees, as shown in FIG. 8B. This morphology differs from the in-line junctions shown in FIG. 1. Crossover junctions are more amenable to fabricating arrays of junctions that are spaced a few nanometers apart. All the crossover nanotube junctions 822 discussed herein may be made, for example, with single nanotubes or SWNT ropes, such as SWNT ropes 820.

Figure 8C:
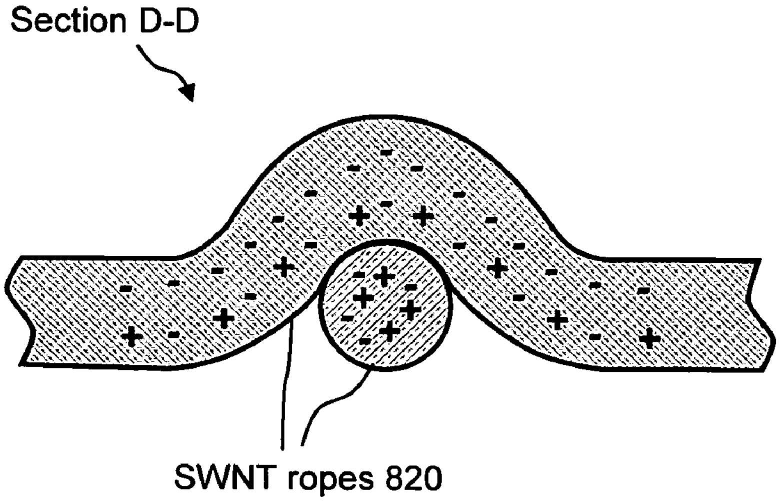
FIG. 8C illustrates a cross sectional view of the crossover nanotube junction, taken along line D-D of FIG. 8B.

FIG. 8C illustrates a cross sectional view of crossover nanotube junction 822, taken along line D-D of FIG. 8B. Metallic nanotube (bundles/ropes or SWNTs) that are in contact with a semiconducting nanotube forms a junction, analogous to a Schottky junction, as electrons are injected into the semiconductor nanotube from the metallic nanotube, as shown in FIG. 8C. The number of electrons in the region of the semiconducting nanotube near the junction can be controlled by applying a voltage between the metallic nanotube and the semiconducting nanotube, in a manner analogous to that in FET. In a processing situation, the voltage difference will depend on the voltage that is applied to each of the nanotubes. The equivalent circuit of the junction is a diode that is connected between the two nanotubes. This configuration can be used to implement diode logic arrays.

When burnt-out ropes that contain both metallic and semiconducting nanotubes are used, some crossover nanotube junctions 822 will form Schottky junctions (metal-to-semiconductor contacts), and some will form resistive junctions (metal-to-metal contacts). The semiconducting nanotubes in a rope that has percolating metallic nanotube paths will look like metallic media, because the metal nanotube are in tangential contact with semiconducting nanotubes, as shown in FIGS. 8B and 8C, which makes electron injection into the semiconductor very efficient. This means that, when a percolated nanotube is used as one of the contacting members, no insulating contacts are seen. Therefore, the semiconducting segments in a percolating rope look like highly doped semiconductors. Preferably, at least one of the layers must be a burnt-out SWNT rope, in order to achieve a reasonable density of Schottky junctions.

In yet another exemplary carbon nanotube electrical device, FIG. 9A illustrates a top view of a 2D nanotube array 900 that has a junction layer in accordance with the invention. 2D nanotube array 900 is representative of yet another example nanotube microelectronic device that is formed by the electrodeposition process of method 200 of FIG. 2 and that is suitable for use in a signal processing application requiring high circuit density. 2D nanotube array 900 includes substrate 810, electrodes 812, electrodes 814, electrode 816, and electrode 818, as described in reference to 2D nanotube array 800 of FIG. 8. 2D nanotube array 900 further includes a first nanotube layer 910 and a second nanotube layer 912, with a junction layer 914 sandwiched therebetween. First nanotube layer 910 and second nanotube layer 912 each include a plurality of single nanotubes or SWNT ropes, such as single nanotubes or SWNT ropes 820 of 2D nanotube array 800, formed between pairs of electrodes.

2D nanotube array 900 can be formed by (1) depositing a set of single nanotubes or SWNT ropes that form first nanotube layer 910, via method 200 of FIG. 2; (2) depositing junction layer 914 by any conventional process; and (3) depositing a set of single nanotubes or SWNT ropes that form second nanotube layer 912, via method 200 of FIG. 2. A crossover nanotube junction 916 can be formed within junction layer 914 in any location where an SWNT rope 820 of second nanotube layer 912 crosses over an SWNT rope 820 of first nanotube layer 910. This is illustrated in more detail in reference to FIG. 9B.

Figure 9B:
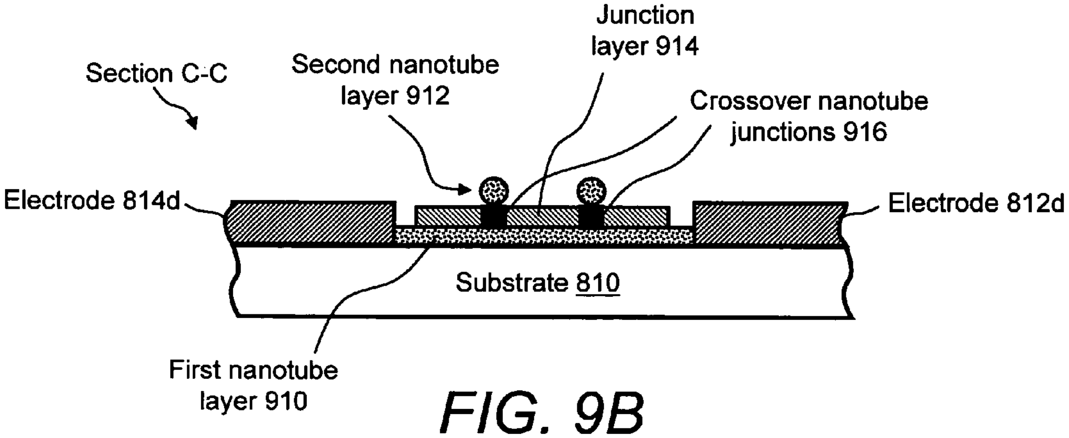
FIG. 9B illustrates the cross sectional view of the two-dimensional nanotube array, taken along line C-C of FIG. 9A.
Figure 9C:
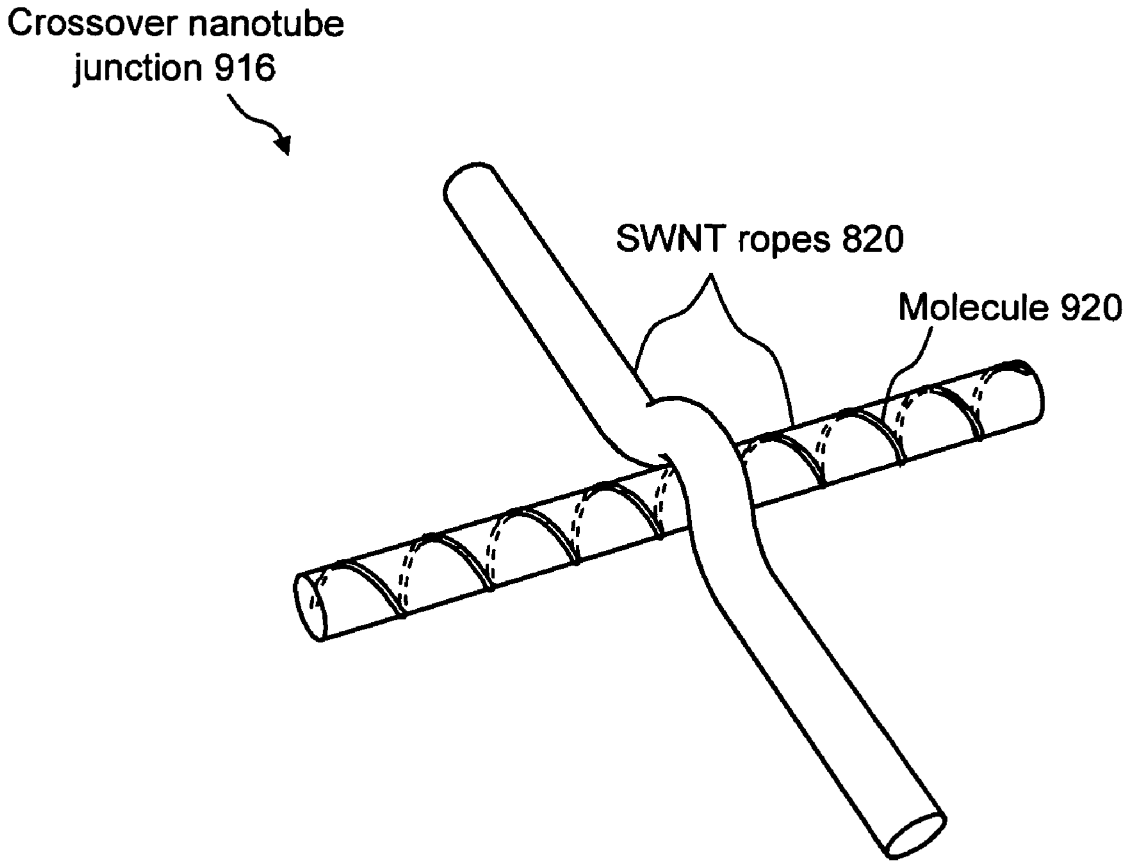
FIG. 9C illustrates an expanded view of an alternative crossover nanotube junction employing two layers of active microelectronic materials to achieve better control of the junction in accordance with an embodiment of the invention.

FIG. 9B illustrates a cross-sectional view of 2D nanotube array 900, taken along line C-C of FIG. 9A, which shows an exemplary crossover nanotube junction 916, formed within junction layer 914. Crossover nanotube junctions 916 are formed by depositing a thin layer (e.g., on the order of about 10 nm) of material, such as junction layer 914, between an SWNT rope 820 of first nanotube layer 910 and an SWNT rope 820 of second nanotube layer 912, at the point of closest contact, as shown in FIG. 9B.

FIG. 9C illustrates an expanded view of an alternative crossover nanotube junction 916 in accordance with an embodiment of the invention. Crossover nanotube junction 916 of FIG. 9C shows the function of junction layer 914 formed by a molecule 920, which wraps SWNT rope 820, as shown in FIG. 9C. Molecule 920 is, for example, but not limited to, a polyaniline molecule.

With continuing reference to FIGS. 8A through 9C, the fabrication of crossover nanotube junctions by the insertion of a thin layer, such as junction layer 914 of 2D nanotube array 900, between the SWNT ropes allows more control of the junction properties than by the placement of the SWNT ropes in direct contact, as shown in 2D nanotube array 800 of FIGS. 8A, 8B, and 8C. However, manufacturing crossover nanotube junctions by bringing the SWNT ropes into direct contact, such as in the case of 2D nanotube array 800, has the advantage of simplicity.

As described with reference to FIGS. 8A through 9C, SWNT ropes or single nanotubes can be used to make junctions, by the insertion of a layer of suitable material between the nanotubes. Additionally, a molecular wrap or an insulating layer that is about 10 nm thick forms a tunnel junction. There are many types of devices standard in the microelectronic art that are formed from tunnel junctions. The simplest tunnel junction application is as a two-state logic device that has a low conductivity state at low voltage and a high conductivity state above a voltage threshold level. A high quality oxide layer may be used to implement an FET, within which a voltage on one nanotube depletes or injects electrons into the other nanotube. One nanotube, in this case, is a semiconducting or burnt-out SWNT rope, while the other is a metallic nanotube or SWNT rope that has percolating metallic paths.

Very dense arrays of junctions may be made by use of crossover nanotube junctions, such as crossover nanotube junctions 822 of 2D nanotube array 800 or crossover nanotube junctions 916 of 2D nanotube array 900. These arrays use the ~1 micron length nanotubes, in order to interface with control, i.e., input and output lines that are formed by conventional lithography. A crossbar geometry is used to define junctions on a submicron (50 nm) scale.

The invention claimed is:

1. A method of forming a semiconductor device, comprising the steps of:

providing a substrate comprising two electrodes wherein the two electrodes are connected to a power supply;

providing a solvent comprising a plurality of semiconducting carbon nanotubes and a plurality of metallic carbon nanotubes;

submersing the substrate in the solvent wherein the plurality of semiconducting carbon nanotubes and plurality of metallic carbon nanotubes form a carbon nanotube bundle disposed between the two electrodes; and ramping a bias voltage across the two electrodes wherein the ramping of the bias voltage removes the plurality of metallic carbon nanotubes in an amount sufficient to form the semiconducting device.

2. A method of forming a semiconducting device comprising:

electrodepositing a bundle of carbon nanotubes comprising metallic carbon nanotubes and semiconducting carbon nanotubes between at least two electrodes; and ramping a bias voltage across the at least two electrodes to remove an amount of metallic carbon nanotubes sufficient to form the semiconducting device, wherein the semiconducting carbon nanotubes form at least one junction.

3. The method of claim 2, wherein the at least two electrodes and the bundle of carbon nanotubes are disposed on a substrate.

4. the method of claim 3, wherein the at least two electrodes are connected to a power source.

5. The method of claim 2, wherein the bundle of carbon nanotubes consists essentially of semiconductive carbon nanotubes after ramping the bias voltage.

6. The method of claim 2, wherein the bundle of carbon nanotubes consists essentially of seminconductive carbon nanotubes and one or more electrically isolated metallic carbon nanotubes after ramping the bias voltage.

7. The method of claim 2, wherein the bundle comprises a first carbon nanotube bundle contacting a second carbon nanotube bundle.

8. The method of claim 2, wherein the bundle has a diameter from about 0.7 to about 3 nanometers.

9. The method of claim 7, wherein the first carbon nanotube bundle is disposed at an angle relative to the second carbon nanotube bundle.

10. The method of claim 2, wherein the semiconducting carbon nanotubes form at least one semiconducting junction.

11. The method of claim 10, wherein the at least one semiconducting junction forms one or more semiconducting devices.

12. The method of claim 2, wherein the bundle of carbon nanotubes is functionalized with one or more biological or chemical materials.

13. The method of claim 11, wherein the device is selected from the group consisting of a photosensor, a biological sensor, a chemical sensor, a carbon-nanotube field-effect transistor, and a multidimensional array of carbon nanotube semiconducting junctions.

14. The method of claim 11, wherein the device comprises at least one array of two or more carbon nanotube junctions deposited on at least one microelectronic substrate.

15. The method of claim 11, wherein the device has a nanosize diameter.

16. The method of claim 15, wherein the diameter is about 0.7 to about 50 nanometers.

17. The method of claim 11, wherein the device has a micron-to-submicron-sized length.

18. The method of claim 17, wherein the length is about 100 to about 1000 nanometers.

19. The method of claim 11, wherein the device comprises a gate structure that is about 0.1 to about 5 nanometers long.

20. The method of claim 2, wherein the spacing of the electrodes is between about 0.15 and 75 microns.

* * * * *